(12) United States Patent
Yoshida et al.

(10) Patent No.: US 6,853,042 B2
(45) Date of Patent: Feb. 8, 2005

(54) HYBRID OPTICAL ELEMENT AND PHOTODETECTOR DEVICE

(75) Inventors: Hiroshi Yoshida, Kanagawa (JP); Tadashi Taniguchi, Kanagawa (JP); Masafumi Ozawa, Kanagawa (JP)

(73) Assignee: Sony Corporation (JP)

( * ) Notice: Subject to any disclaimer, the term of this patent is extended or adjusted under 35 U.S.C. 154(b) by 56 days.

(21) Appl. No.: 10/416,720

(22) PCT Filed: Sep. 19, 2002

(86) PCT No.: PCT/JP02/09647

§ 371 (c)(1),
(2), (4) Date: May 14, 2003

(87) PCT Pub. No.: WO03/028117

PCT Pub. Date: Apr. 3, 2003

(65) Prior Publication Data

US 2004/0026756 A1 Feb. 12, 2004

(30) Foreign Application Priority Data

Sep. 20, 2001 (JP) ........................................ 2001-287564

(51) Int. Cl.$^7$ ............................................ H01L 31/0232

(52) U.S. Cl. .......................... 257/432; 257/98; 257/431; 257/436; 257/749; 438/22; 438/48; 438/65; 438/608

(58) Field of Search ................................. 257/431–440, 257/98, 749

(56) References Cited

U.S. PATENT DOCUMENTS

5,136,152 A * 8/1992 Lee ............................ 257/699
2001/0046200 A1 11/2001 Saeki

FOREIGN PATENT DOCUMENTS

| JP | 4-102239 A1 | 4/1992 |
| JP | 4-105557 A1 | 9/1992 |
| JP | 2000-183368 A1 | 6/2000 |
| JP | 2000-193421 A1 | 7/2000 |
| JP | 2000-228534 A1 | 8/2000 |
| JP | 2001-28142 A1 | 1/2001 |
| JP | 2001-256662 A1 | 9/2001 |

OTHER PUBLICATIONS

International Search Report Nov. 12, 2002.

* cited by examiner

*Primary Examiner*—David Nelms
*Assistant Examiner*—Andy Huynh
(74) *Attorney, Agent, or Firm*—Ronald P. Kananen; Rader, Fishman & Grauer PLLC

(57) ABSTRACT

The present invention concerns a hybrid optical element including at least one optical element (2) attached to one surface of a substrate (1), a semiconductor laser (3) and a photodetector (4) attached to the other surface of the substrate (1) and an intermediate member (relay substrate) (5) interposed between the substrate (1) and the photodetector (4). The intermediate member (5) has a through hole (6) through which a light flux incident on the photodetector (4) is allowed to pass and a part with a conductivity by which a terminals of the photodetector (4) are connected to a conductor pattern on the substrate (1).

12 Claims, 16 Drawing Sheets

HYBRID OPTICAL ELEMENT AND PHOTODETECTOR DEVICE

TECHNICAL FIELD

The present invention relates to a hybrid optical element and photodetector device employed for an optical pick-up device that writes an information signal in an optical recording medium such as an optical disc or reads out the information signal recorded on the optical recording medium.

BACKGROUND ART

In a recording and reproducing system which employs, as a recording medium, an optical disc such as a CD (Compact Disc), what is called an MD which is a small magneto-optical disc with a diameter of 64 mm, a DVD (Digital Versatile Disc) or the like, a device has been hitherto demanded to be more compact, lighter and more inexpensive. In order to meet such a demand, individual component parts need to be compact and light and inexpensively manufactured. An optical pick-up device for the above-described optical disc realizes a compact, light and further inexpensive structure of the device itself by integrating a semiconductor laser serving as a light source and a photodetector such as a Pin diode composed of silicon (Si) as a base material.

The photodetector used for the optical pick-up device is formed as what is called a "PDIC" (photodetector device) composed of one chip in which is incorporated an integrated circuit for performing processes and calculation of a light receiving signal such as receiving light reflected from the optical disc, converting the light into an electric signal and outputting the signal to integrate functions for receiving light, calculating the received light, converting the received light into an electric signal and outputting the electric signal, so that the compact, light and further inexpensive optical pick-up device using the photodetector is realized.

Here, elements capable of being integrated and compact by adding optical parts such as a prism, a lens, a diffraction grating, a hologram, etc. to the light source and the photodetector forming the optical pick-up device are generally referred to as hybrid optical elements. As shown in FIG. 1, the hybrid optical element includes a semiconductor laser 101, a PDIC 102 and optical elements such as lenses, prisms, diffraction gratings, holograms, etc. arranged on a substrate 104 which are electrically or mechanically connected together.

The semiconductor laser 101 is attached to a sub-mount 101a by a chip mount step. The sub-mount 101a is attached to the PDIC 102 by a die bonding step. At this time, in the sub-mount 101a, connection terminals are electrically connected to wiring pads of a PDIC substrate 102a forming the PDIC 102. On the PDIC substrate 102a, markers 102c showing positions in which the sub-mounts 101a are arranged are provided. The sub-mount 101a has its attached positions positioned to the PDIC substrate 102a and is attached to the PDIC substrate 102a in such a manner that markers 101b provided on the sub-mount 101a itself are made to correspond to the markers 102c.

To the PDIC substrate 102a of the PDIC 102, photodetectors 102b are attached. On the PDIC 102, a prism 103 is attached by a prism mount step. The PDIC 102 is attached on a substrate 104 by a PDIC mount step.

In manufacturing the hybrid optical element, markers 104a as the marks of positions are further previously provided on the substrate 104 and the respective parts are attached to the substrate 104 by using these markers 104a as references for positioning. The above-described positioning method is referred to as a "passive alignment". The accuracy of the hybrid optical element is determined by the accuracy of a positioning (alignment) step of each parts relative to the substrate.

In the substrate 104, electrodes 104b to which the PDIC 102 is electrically connected are provided. The PDIC 102 is electrically connected to the electrodes 104b by a wire bonding step as shown by arrows in FIG. 1.

The parts respectively forming the hybrid optical element are basically arranged as shown in FIG. 2. That is, the semiconductor laser (light source) 101, a signal recording surface of an optical disc 107 and a light receiving part of the photodetector 102b are respectively arranged to be located at positions of image points through the reflection surface of the prism 103. The positions of the respective parts are arranged so as to deviate from other positions.

In other words, a light flux outgoing from the semiconductor laser 101 is a diffusion light flux that is light having only a semiconductor laser side as a focal point. The light flux outgoing from the semiconductor laser 101 is allowed to be a parallel light flux by a collimator lens 105 and converged on the signal recording surface of the optical disc 107 by an objective lens 106. At this time, the objective lens 106 is controlled to move in a focusing direction parallel to an optical axis so that a focal point is always formed on the signal recording surface of the optical disc 107.

The light applied to the signal recording surface of the optical disc 107 is reflected on the signal recording surface and converged on lenses 108 and 109 through the objective lens 106, the collimator lens 105 and the prism 103 and returned to the photodetector 102b. The optical elements are respectively arranged so that the reflected light from the signal recording surface of the optical disc 107 focuses on the light receiving part of the photodetector 102b. That is, the light is located respectively at the focal points in the semiconductor laser 101, the signal recording surface of the optical disc 107 and the light receiving part of the photodetector 102b. This means that the light source, the signal recording surface and the light receiving part are located at the positions of image points.

On the other hand, for more inexpensively providing the hybrid optical element, the number of parts is devised to decrease as many as possible. For instance, as shown in FIG. 3, in the structure that lights are returned respectively to a plurality of light receiving parts of the photodetector 102b having the optical path lengths from the signal recording surface of the optical disc different from each other, one lens 110 is used as a lens for respectively providing the light fluxes in the light receiving parts as focal points on the light receiving parts.

Since the optical distances to the light receiving parts from the lens 110 are precisely different from each other, the hybrid optical element does not obtain the focal points at the same time. However, a focus error signal, a tracking error signal, a reflection signal (RF signal) based on the reflected light flux read from the optical disc or the like may be obtained so as to be allowable in practice. A step for reducing and adjusting the number of optical parts is simplified as mentioned above, so that the compact and inexpensive hybrid optical element can be realized.

The wavelength of light emitted from a light source used for the optical pick-up device is shortened as well as the versatility of recording media such as the optical disc.

For meeting the versatility of the recording media, there are proposed optical discs such as a ROM optical disc in which an information signal is formed on a disk substrate by a micro irregular pit pattern, a phase change optical disc having a phase change recording layer in which an information signal can be recorded and reproduced, a magneto-optical disc having a magneto-optical recording layer in which an information signal can be recorded and reproduced, etc.

In the ROM optical disc and the phase change optical disc, there are provided areas having different reflectance depending on the information signals recorded on the optical disc and the change of light intensity due to the difference in reflectance of light fluxes reflected from the areas is detected to read the information signals recorded thereon. The magneto-optical disc uses a magneto-optical Kerr effect in the magneto-optical recording layer and reads the information signals recorded based on the difference in polarizing angle of the reflected lights.

The optical pick-up devices used for reading the information signals from these optical discs are also requested to satisfy respective systems so as to meet the optical discs having the above-described versatile recording systems. In the optical pick-up devices, the structures of the hybrid optical elements to be used are respectively different so as to meet the optical discs respectively having different recording systems.

For instance, the photodetector 102b of the optical pick-up device used for reading the information signals from the ROM optical disc on which the information signals are recorded by the pit pattern may be provided with, as shown in FIG. 4, one four-divided light receiving part 111 for detecting a focus error signal and an RF signal and two light receiving parts 112 and 113 for detecting a tracking error signal which are arranged at positions to sandwich the four-divided light receiving part 111 in between them. The structure of the optical element for making the light reflected from the optical disc incident on these light receiving parts is also simple. As compared therewith, the photodetector 102b of the optical pick-up device employed for reading the information signals recorded on the magneto-optical disc needs, as shown in FIG. 5, light receiving parts 114 and 115 for detecting light intensity for each of different polarized states in addition to one four-divided light receiving part 111 for detecting a focus error signal and an RF signal and two light receiving parts 112 and 113 for detecting a tracking error signal. That is, since a magneto-optical signal is feeble, a differential detection needs to be carried out by using the two light receiving parts 114 and 115 on the photodetector 102b. As described above, the number of the light receiving parts is increased so that the structure of the optical element for making the light reflected from the optical disc incident on these light receiving parts is likewise complicated. In other words, in order to make the light reflected from the optical disc incident on these light receiving parts, the reflected light needs to be branched into three light fluxes and at least two prisms are required. At this time, as for the change of polarizing direction due to the magneto-optical Kerr effect, polarized waves are divided into P-polarized waves and S-polarized waves relative to the reflecting surfaces of the prisms. The S-polarized wave is reflected on the reflecting surface of one prism to allow it to be incident on one light receiving part 114 of the photodetector 102b and the P-polarized wave is reflected on the reflecting surface of the other prism to allow it to be incident on the other light receiving part 115 of the photodetector 102b. Thus, the change of the polarizing direction can be detected. As for the reflected light when there is no information signal recorded on the optical disc, the arrangement of the hybrid optical element needs to be determined so that the intensity of the S-polarized wave is equal to that of the P-polarized wave or the optical elements such as a ½ wavelength plate need to be used. As described above, to meet the various kinds of optical discs having different recording systems, the structure of the hybrid optical element having the optical pick-up device is complicated.

On the other hand, in order to meet the short wavelength of light emitted from the light source, the index of refraction and the angle of diffraction of the optical elements forming the optical pick-up device cause problems. For instance, for the optical pick-up device used for reading the information signals of the optical disc such as a CD on which the information signals are recorded by the pit pattern or the magneto-optical disc such as an MD, a light source for emitting light whose wavelength is 780 nm is employed. For the optical pick-up device used for a DVD, a light source for emitting light whose wavelength is 650 nm is employed. Further, for the optical pick-up device used for the optical disc capable of performing a high density recording, a light source for emitting light whose wavelength is 450 nm is employed.

When the index of refraction of the optical elements employed for the optical pick-up device is examined, its imaginary part, that is, its absorption is firstly apprehended. In optical glass or a synthetic resin material used as the material of the optical elements of the optical pick-up device, light having the wavelength shorter than about 400 nm is greatly absorbed. When such absorption arises, the output of emitted light of the light source needs to be more increased in order to obtain necessary reflected light. Further, since the change in quality of the optical elements is generated, the degree of freedom in selecting the materials of the optical elements is restricted. As the wavelength of a light flux becomes short, the angle of diffraction becomes small. For instance, assuming that the pitch of the diffraction grating is d, the angle of diffraction θ in this diffraction grating is represented as described below.

$$\sin \theta = m\lambda/(nd) \quad (1)$$

(Here, m designates an integer, 1 designates wavelength and n designates index of refraction.)

According to this formula (1), as the wavelength of the light flux becomes short and λ becomes small, the angle of diffraction θ becomes small under a condition that the pitch d and the index of refraction n are constant.

The plural light receiving parts formed on the PDIC need to be formed to have respective sizes and spaces so that photodetection signals corresponding to light fluxes respectively incident on the light receiving parts can be independently detected. Each size and space are determined depending on the property of the photodetector and a capability of a manufacturing step, and do not directly undergo a limitation of the wavelength of the light flux. That is, it may be said that the size and space of each light receiving part on the photodetector are determined independently of the wavelength of light emitted from the light source. Accordingly, the size and space in which each light receiving part can independently detect the photodetection signal may be considered not to depend on the wavelength of light emitted from the light source and to be constant.

In this case, according to the above-described formula (1), an optical distance to each light receiving part from the diffraction grating needs to be lengthened in order to distribute the reflected light to and receive it by each light receiving part, so that the structure may be possibly enlarged. In this case, as mentioned above, even when the focus positions of the reflected light are displaced from the position of the photodetector within an allowable range to make it easy to form the hybrid optical element, the allowable range is extremely narrowed. In the present case, the structure that the reflected light is converged on a plurality of light receiving parts by one lens as described above cannot be employed.

As described above, when the method for using the markers as positioning marks to position the optical elements as mounting means is employed, it is difficult to obtain a good positioning accuracy due to a fact that the optical distance is long and an adequate positioning cannot be realized. When the optical distance to the light receiving part from the diffraction grating increases twice for an angle setting accuracy with the same accuracy, the positional displacement between the light receiving part and a spot of light will become twice. The above-described positional displacement between the light receiving part and the spot of light causes the quality of the photodetection signal which is to be detected to be deteriorated. In the worst case, it is anticipated that the photodetection signal is not detected.

As mentioned above, in the hybrid optical element forming the optical pick-up device, a signal detecting system is complicated with the versatility of the optical discs as well as the improvement of the recording density, and further, a high accuracy in assembly is required.

For satisfying such a request, a double sided mounting is carried out so that the optical elements such as a lens, a prism, a diffraction optical element, etc. are attached to one surface of a substrate serving as a base and a semiconductor laser serving as a light source and photodetectors are attached to the other surface of the substrate. Further, in an assembly step, while viewing the state of the photodetection signal, a positioning (active alignment) is carried out. In order to realize the above-described structure and the assembly step, the substrate, the optical elements, the semiconductor laser and the photodetector need to be formed in configurations adapted to such structure and assembly step. Firstly, as shown in FIG. 6, it is necessary to form a light transmission hole 116 on a substrate 104 so that the light receiving part 102c of a photodetector 102b can detect the reflected light reflected by the optical disc through the light transmission hole 116. The photodetector 102b needs to be attached to the substrate 104 so as to oppose the light receiving part 102c to the substrate 104.

An electric signal detected in accordance with the reflected light received by the photodetector 102b needs to be taken outside the package of the hybrid optical element. As a first structure to this end, there is a structure that wiring is provided on a substrate 104 and a terminals of photodetectors are directly connected to the wiring.

As a second structure, for example, as described in Japanese Patent Application Laid-Open No. 2000-228534 and Japanese Patent Application Laid-Open No. 2000-183368, there is a structure that a relay substrate through which electrodes are taken out is interposed between photodetectors and a substrate. In the Japanese Patent Application Laid-Open No. 2000-228534, there is disclosed a structure that the photodetectors are connected to the relay substrate by an anisotropic conductive material. In the Japanese Patent Application Laid-Open No. 2000-183368, there is disclosed a structure that optical elements are attached to one surface side of the relay substrate and the photodetectors are attached to the other surface side by a flip chip bonding method.

As a third structure, photodetectors are used having a structure that light receiving parts and electrode terminals are formed on opposite surfaces to each other.

However, the conventionally used photodetectors have structures that the light receiving parts and the electrode terminals are provided on the same surface and do not have structures that the light receiving part and the electrode terminals are respectively arranged on both the surfaces of one surface and the other surface.

The conventional hybrid optical element utilizes a structure that when the photodetectors are sealed in package (PKG), the chips of the photodetectors are mounted on a resin mold package and a wire bonding process is applied thereto to form a light receiving side with a molded resin, or a structure that the chips of the photodetectors are mounted on a hollow package made of a molded resin or ceramics, a wire bonding process is applied thereto, and the package is covered with a flat plate made of a glass substrate or a synthetic resin.

As described above, the hybrid optical element and the PDIC (photodetector device) have the structure of the signal detecting system complicated, need to have a high accuracy in assembly and not to carry out the conventional passive alignment, but to carry out the active alignment.

As the structures in which the active alignment can be carried out, it may be said that the third structure is the simplest among the first to third structures. In the third structure, as shown in FIGS. 7A to 7C, a photodetector 102b is bonded to a substrate 104 by, for instance, a UV (ultraviolet ray) curing resin so that the light receiving surface of the photodetector 102b comes into contact with the substrate 104 and electrodes for taking out signals are formed on a surface opposite to the light receiving surface so that the signals can be taken outside a package.

For manufacturing the photodetector having the above-described structure, there exist some technical problems to be solved. As one of the problems, there may be considered a formation of a light transmission hole. In the photodetector, the light transmission hole 116 having the depth not less than the thickness of the substrate 104 needs to be provided. Accordingly, there may be considered problems such as the relation between the opening area of the light transmission hole 116 and the size of the photodetector 102b, or an insulating part to be provided on the inner peripheral surface of the light transmission hole 116 and the disconnection and reliability of an electrode material to be inserted. Therefore, the photodetector having such a configuration is hardly formed.

The photodetector 102b disposed on the substrate 104 is, as shown in FIG. 7C, electrically connected to the substrate 104 by wire-bonding between wire bonding pads 104c provided on the substrate 104 and wire bonding pads 102d provided on the photodetector 102b.

On the other hand, in the first structure, that is, the structure that the photodetectors having the light receiving parts and the electrode parts formed on the same surface are directly bonded to the substrate by a flip chip bonding process, it is difficult to carry out the active alignment in which an assembly and a positional adjustment are performed while viewing photodetection signals from the photodetectors.

In order to output the photodetection signal from the photodetector during a positioning operation while using the first structure, for instance, as shown in FIG. 7, a conductor such as a probe pin 117 needs to be brought into contact with the electrode part of the photodetector 102b. That is, when the active alignment is carried out in the first system, a space into which the probe pin 117 is adequately inserted needs to be provided between the photodetector 102b and the substrate 104 while the position of the photodetector 102b is adjusted. Under a state that the substrate 104 is kept coming into contact with the photodetector 102b, the position of the photodetector 102b cannot be adjusted. When the space is provided between the photodetector 102b and the substrate 104 during adjusting the position of the photodetector 102b, a spot size on the light receiving surface upon adjustment of the position is different from a spot size after the assembly. Therefore, an output signal which is precisely obtained upon adjustment changes after the assembly so that a precise positional adjustment is difficult.

It is extremely difficult to employ the first to third structures for the hybrid optical element in which at least one of optical elements a lens, prism, a diffraction element, etc., a light emitting element, and photodetectors are mounted on both the surfaces of the substrate from the viewpoints as mentioned above.

When the photodetectors are sealed in a package (PKG), when a light source such as a violet blue laser which emits light whose wavelength is short, for example, about 400 nm is used, most of molded resins absorb the light located in this wavelength band, so that a synthetic resin material which has been hitherto employed for infrared rays or visible lights (red to blue) cannot be used.

That is, in the structure that the chips of the photodetectors are mounted on the resin mold package and the wire bonding process is applied thereto to form the light receiving side by the molded resin, the molded resin having a high transmission factor in a short wavelength band needs to be used, however, when a moldability and sealing characteristics or the like are taken into consideration, there is no proper material. In the structure that the chips of the photodetectors are mounted on the hollow package made of the molded resin or ceramics, the wire bonding process is applied thereto, and then, they are covered with the flat plate made of the glass substrate or the synthetic resin or the like, not only does a manufacturing cost becomes high, but also an entire size is enlarged.

DISCLOSURE OF THE INVENTION

It is an object of the present invention to provide a new hybrid optical element and a photodetector device in which the above-described problems of the prior art can be eliminated.

It is another object of the present invention to provide a hybrid optical element and a photodetector device in which a compact and light structure is realized and the positions of photodetectors are easily and highly accurately adjusted.

A hybrid optical element according to the present invention comprises a substrate; at least one optical element attached to one surface of the substrate; a light emitting element and a photodetector attached to the other surface of the substrate; and an intermediate member interposed between the substrate and the photodetector. A base material constituting the intermediate member is formed with a material having an absorption property in the wavelength of light emitted from the light emitting element. The intermediate member has a hole part through which a light flux incident on the photodetector is allowed to pass and a part with a conductivity. The terminal of the photodetector is connected to a conductor pattern on the substrate by the part with the conductivity. The intermediate member functions as a relay substrate for connecting the terminal of the photodetector to the conductor pattern on the substrate.

Another hybrid optical element according to the present invention comprises a substrate; at least one optical element attached to one surface of the substrate; a light emitting element and a photodetector attached to the other surface of the substrate; and an intermediate member interposed between the substrate and the photodetector. The intermediate member is composed of a material having no absorption property in the wavelength of light emitted from the light emitting element, that is, a transparent base material having transmission characteristics and has a part with a conductivity by which the terminal of the photodetector is connected to a conductor pattern on the substrate.

A photodetector device according to the present invention comprises a substrate; at least one optical element attached to one surface of the substrate; a photodetector attached to the other surface of the substrate; and an intermediate member interposed between the substrate and the photodetector. The intermediate member is formed with a transparent material having no absorption property in the wavelength of light emitted from a light emitting element, that is, a transparent base material having transmission characteristics and has a part with a conductivity by which the terminal of the photodetector is connected to a conductor pattern on the substrate.

A hybrid optical element according to the present invention is manufactured by attaching at least one optical element to one surface of a substrate having a conductor pattern; attaching a light emitting element to the other surface of the substrate; positioning a photodetector to be attached to an intermediate member having a hole part through which a light flux incident on the photodetector is allowed to pass and a part with a conductivity and interposed between the substrate and the photodetector; then, attaching the intermediate member to the other surface of the substrate; and further connecting the terminal of the photodetector to a conductor pattern on the substrate through the part with the conductivity of the intermediate member.

Still another objects of the present invention and specific advantages obtained by the present invention will become more apparent from the following description of embodiments made by referring to the drawings.

BEST MODE FOR CARRYING OUT THE INVENTION

Figure 1:
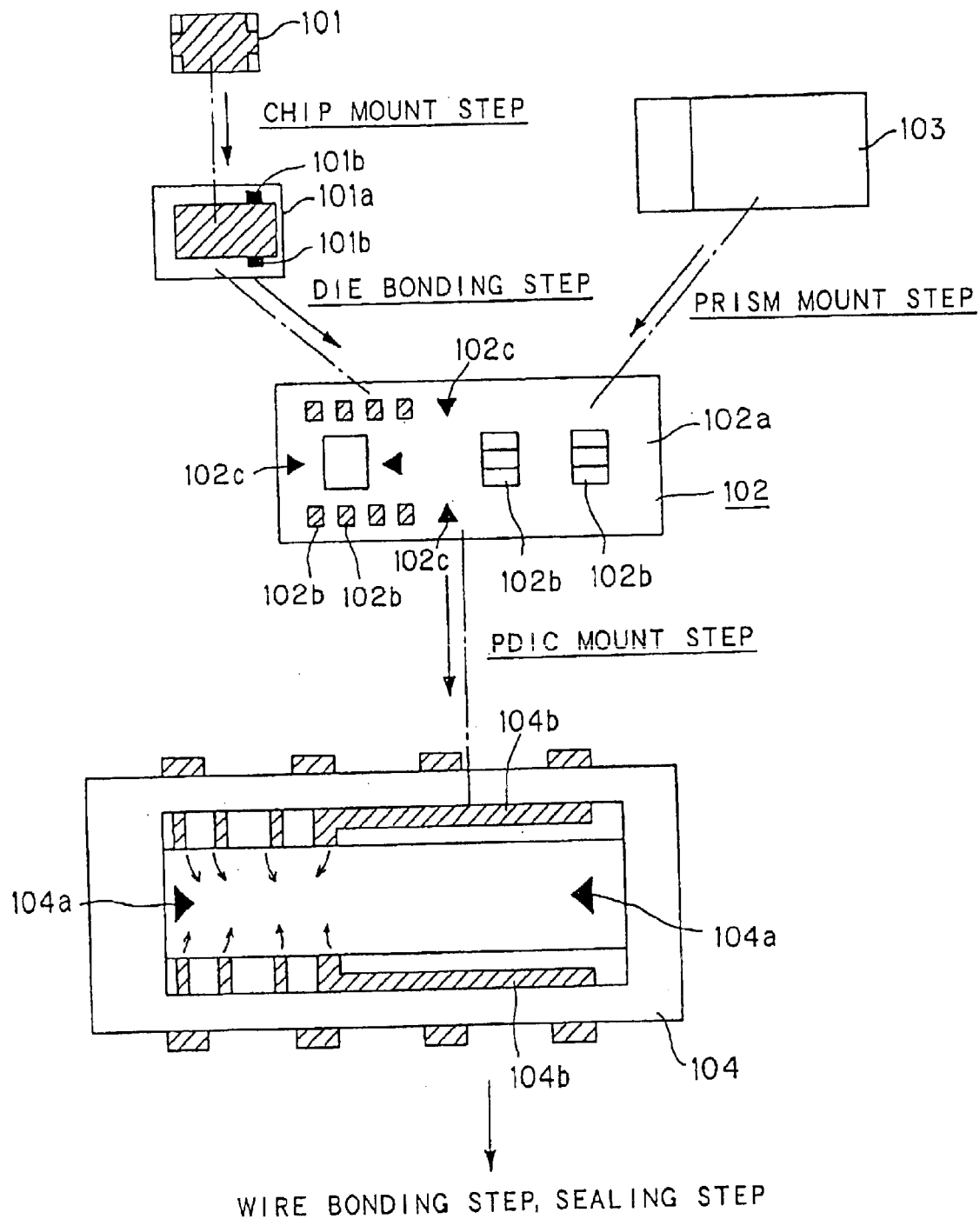
FIG. 1 is a plan view showing assembly steps of a conventional hybrid optical element.
Figure 2:
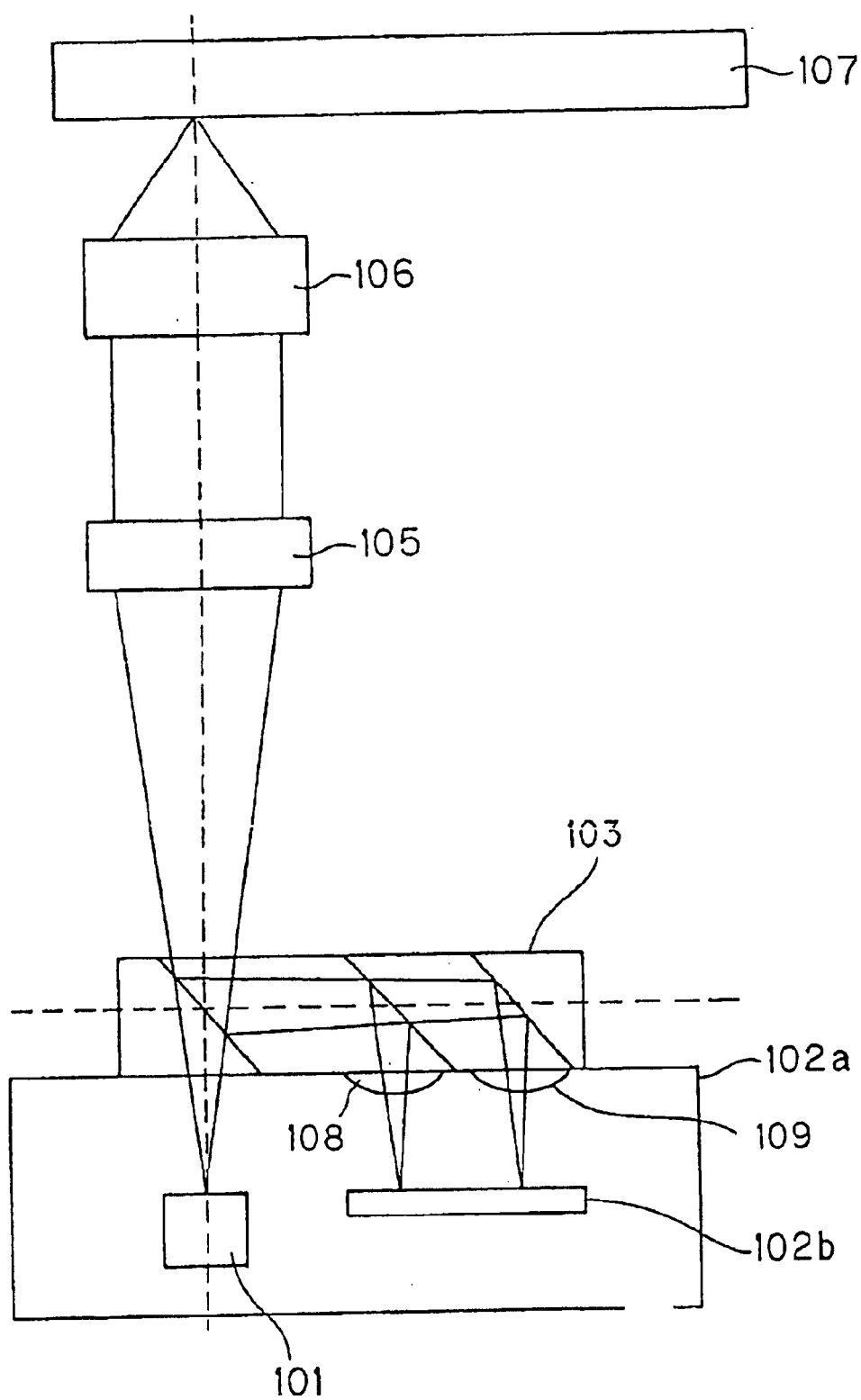
FIG. 2 is a side view showing an optical pick-up device formed by using the hybrid optical element.
Figure 3:
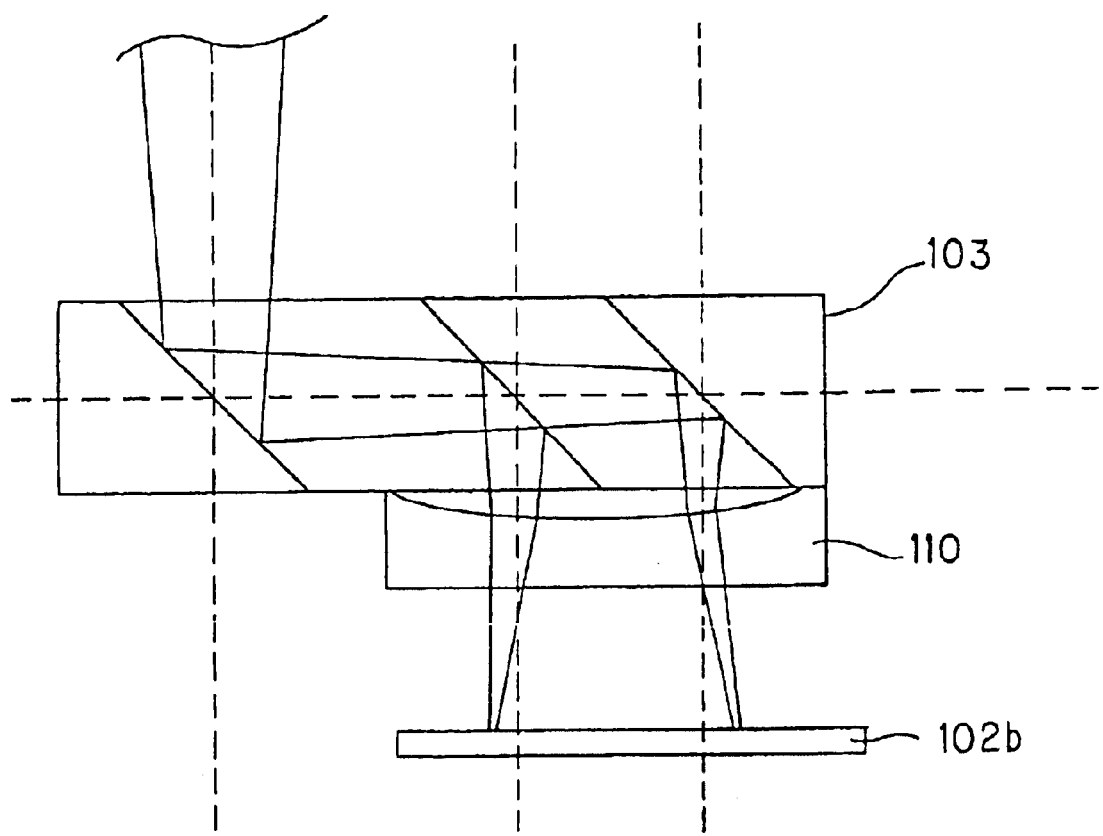
FIG. 3 is a side view showing another example of the conventional hybrid optical element.
Figure 4:
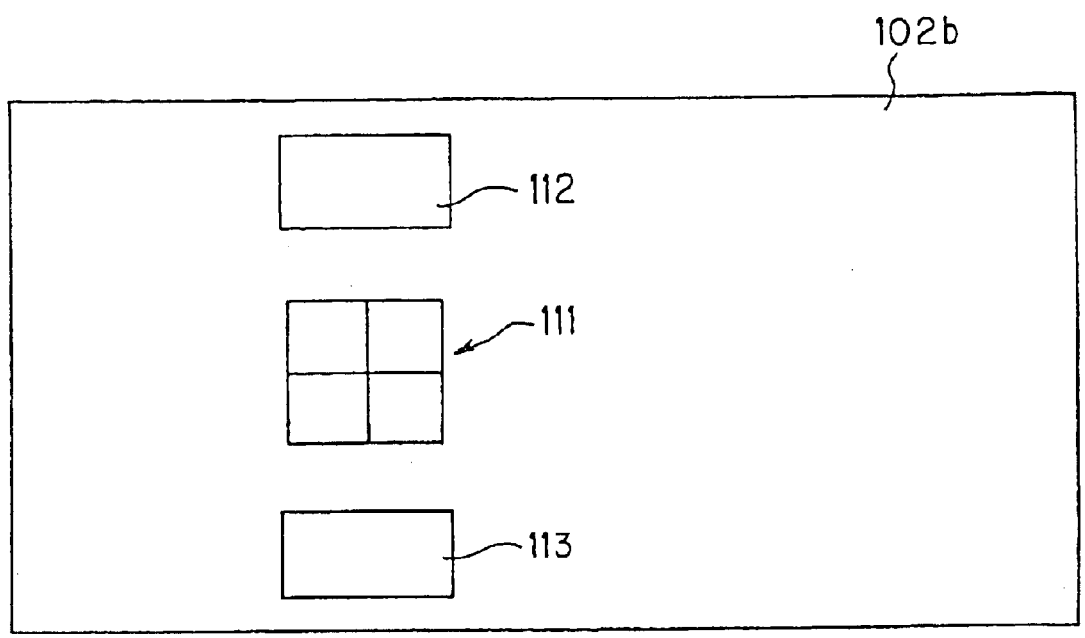
FIG. 4 is a plan view showing a pattern of a light receiving part of a photodetector in the hybrid optical element.
Figure 5:
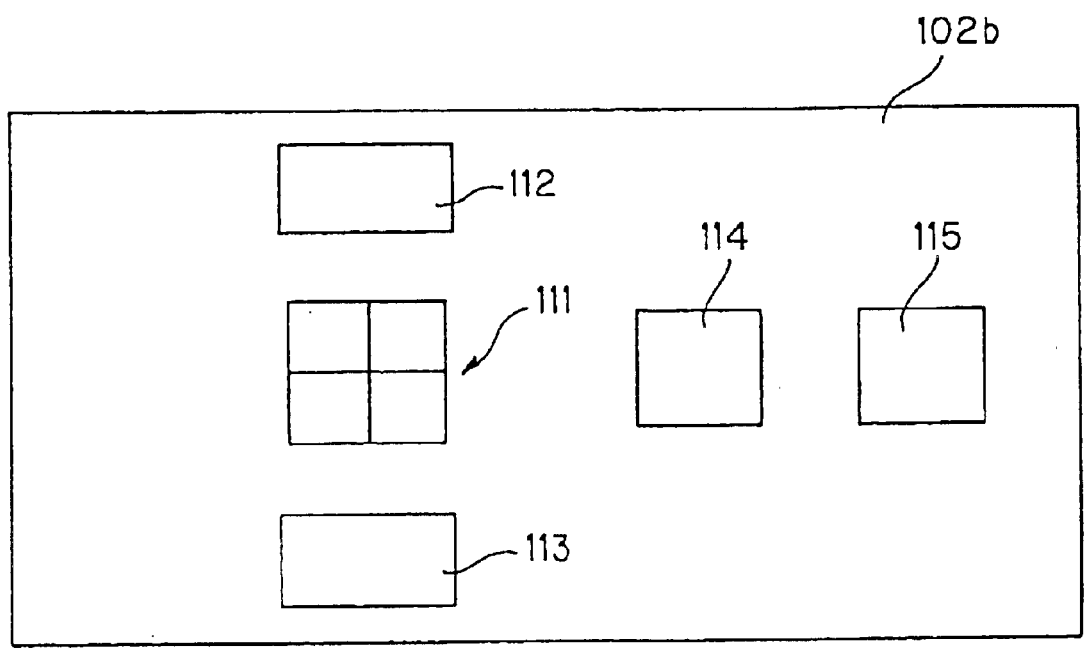
FIG. 5 is another plan view showing other example of the pattern of the light receiving part of the photodetector in the hybrid optical element.
Figure 6:
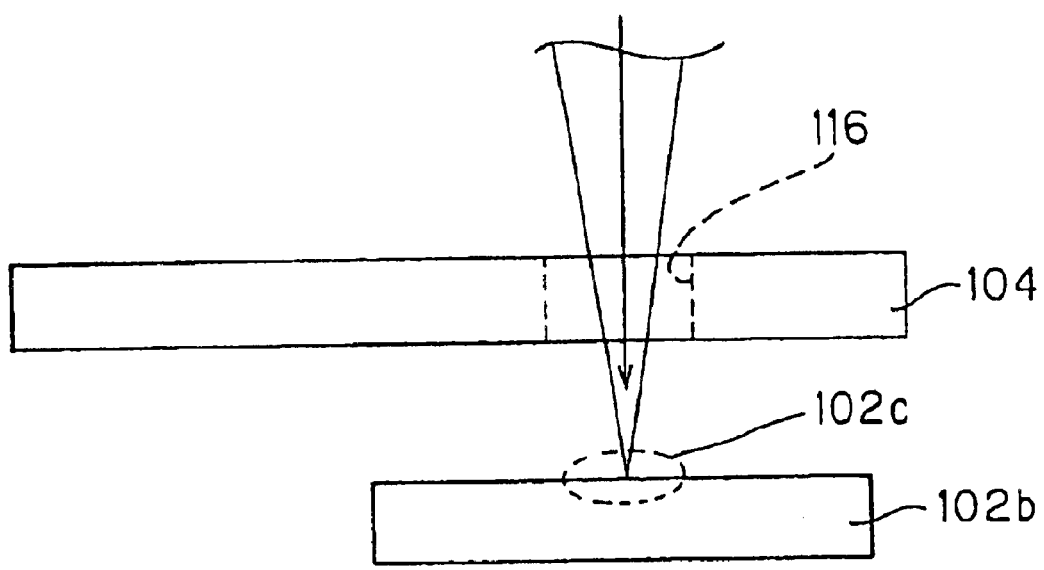
FIG. 6 is a side view showing the structure of a main part of the conventional hybrid optical element.
Figure 7A:
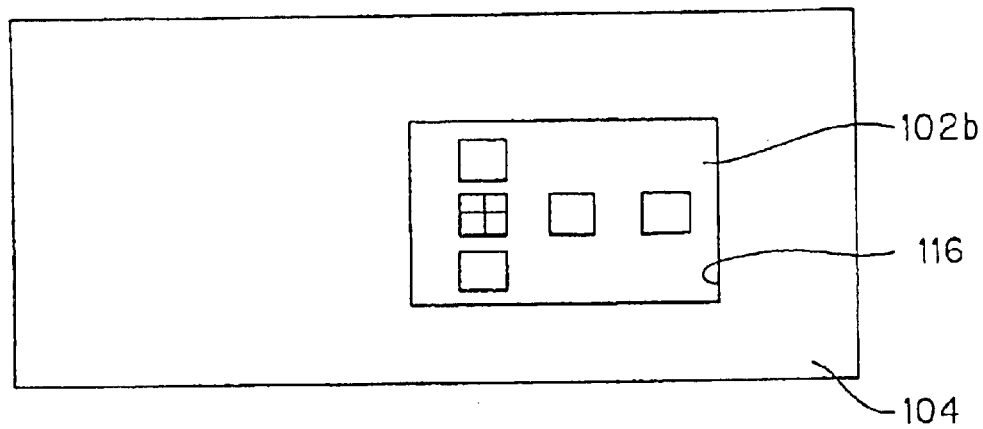
FIG. 7A is a plan view showing the structure of the conventional hybrid optical element.
Figure 7B:
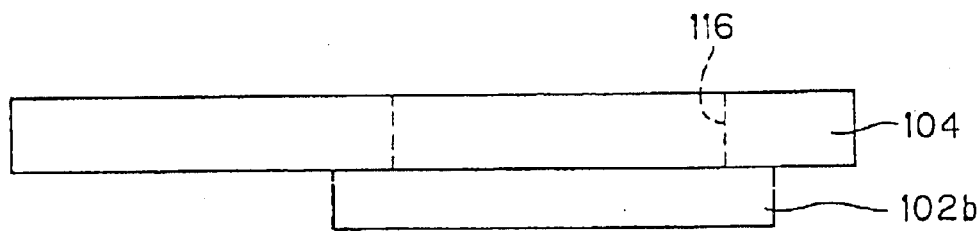
FIG. 7B is a side view thereof and FIG. 7C is a bottom view thereof.
Figure 7C:
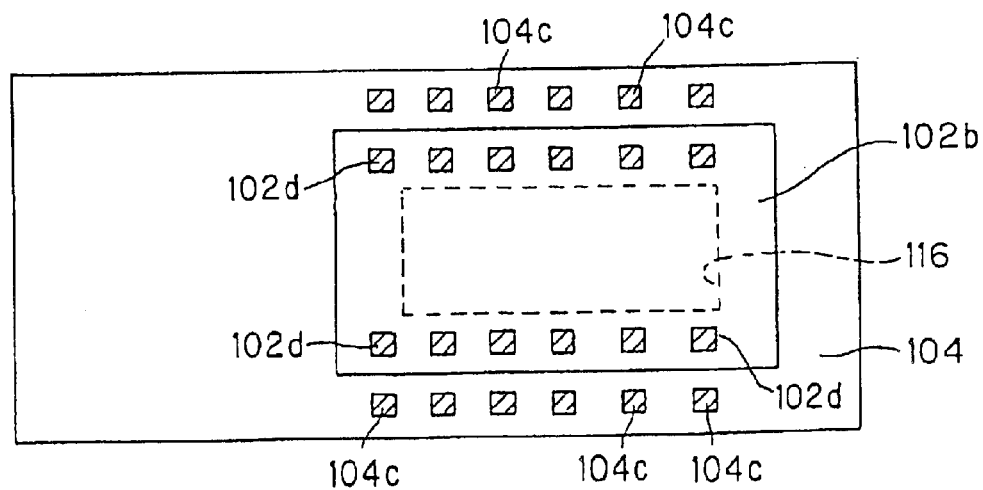
Figure 8:
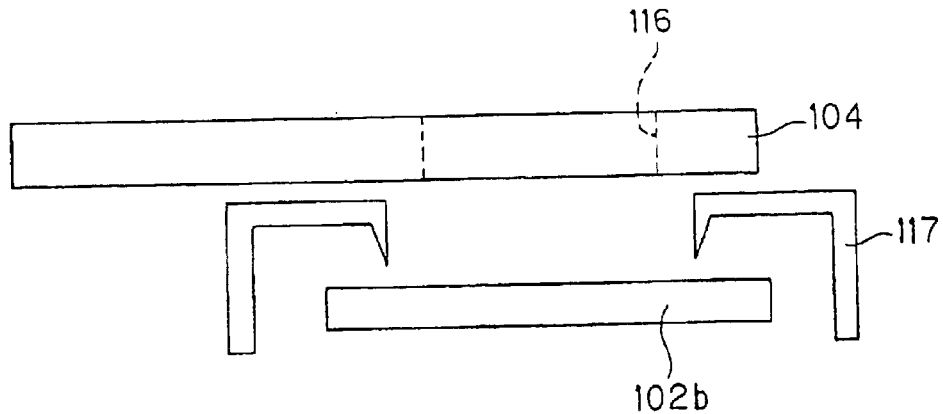
FIG. 8 is a side view showing an adjusting step of the conventional hybrid optical element.

Now, referring to the drawings, embodiments of the present invention will be described below.

Figure 9:
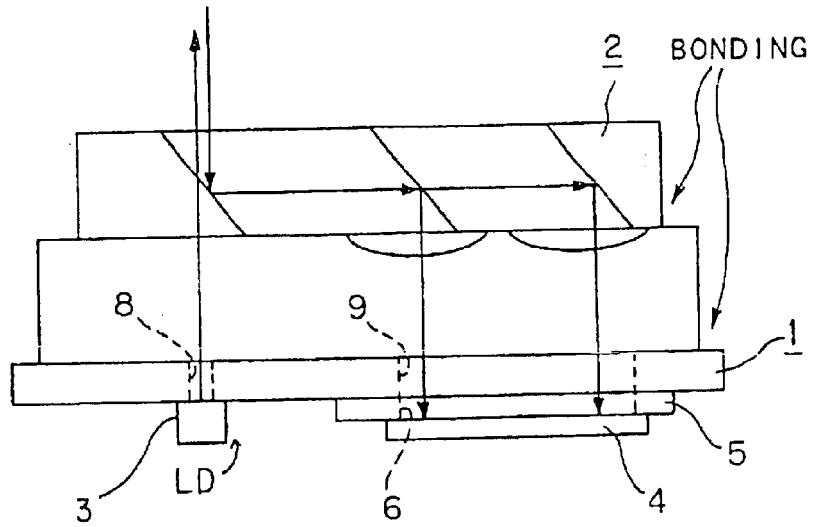
FIG. 9 is a side view showing the structure of a hybrid optical element according to the present invention.

A hybrid optical element and a photodetector device according to the present invention comprises, as shown in FIG. 9, at least one optical element 2 including a lens, a prism and a diffraction element attached to one surface side of a substrate 1, and a semiconductor laser 3 as a light emitting element and a photodetector 4 attached to the other surface of the substrate 1. Between the substrate 1 and the photodetector 4, a relay substrate 5 serving as an intermediate member is interposed. A method for manufacturing the hybrid optical element according to the present invention is a method for manufacturing such a hybrid optical element.

On the substrate 1, a first through hole 8 is formed for allowing a light flux outgoing from the semiconductor laser 3 to pass to the one surface side of the substrate 1. On the substrate 1, a second through hole 9 is formed for making light reflected from an optical disc incident upon the photodetector 4 from the one surface side of the substrate 1 as described below. As the semiconductor laser 3, a semiconductor laser is used having the wavelength band of emitted light in the vicinity of 400 nm or nearer to an ultraviolet radiation side than thereto.

Figure 10:
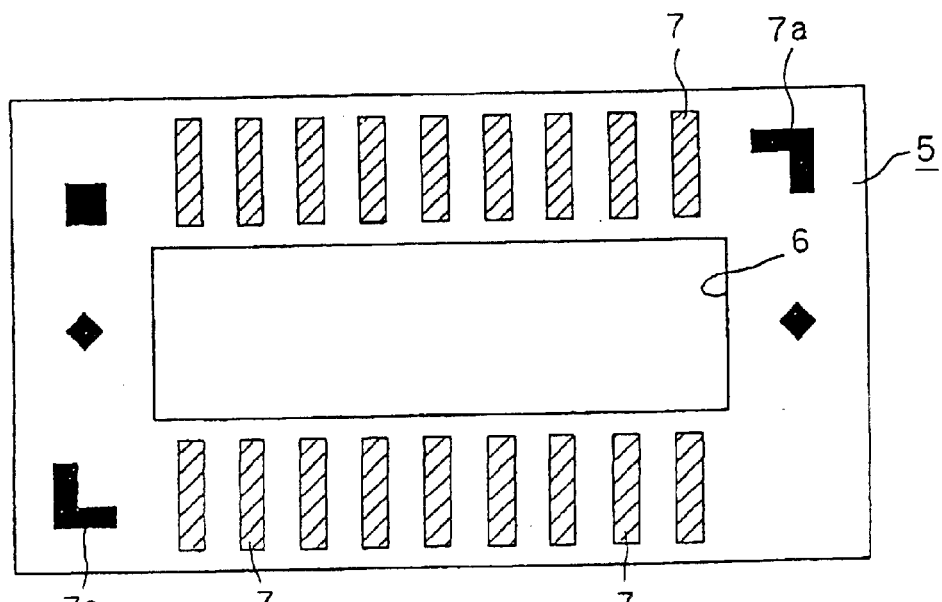
FIG. 10 is a plan view showing a relay substrate made of a material having no light transmission characteristics which forms the hybrid optical element.

The relay substrate 5 is formed of a material having an absorption property in the wavelength of light emitted from the semiconductor laser 3 as a base material. As materials having absorbing characteristics of the light of wavelength in the vicinity of 400 nm or the light of wavelength nearer to the ultraviolet radiation side than thereto, there can be used any ceramic materials such as alumina, aluminum nitride or glass epoxy, or any semiconductor materials such as silicon, gallium-arsenic, indium-phosphorus or zinc selenide. On the relay substrate 5 formed by using the above-described materials, a third through hole 6 is formed for allowing the reflected light from the optical disc to pass, as shown in FIG. 10.

The third through hole 6 provided on the relay substrate 5 is formed to have a size so as to allow at least the entire part of the photodetector 4 to face the one surface side of the substrate 1. Further, when the third through hole 6 has such a size as to allow markers for positioning provided on the photodetector 4 arranged to be superposed on the relay substrate 5 to face it, the assembling step can be made easy and the structure of an assembling device can be simplified.

On the one surface of the relay substrate 5, wiring 7 is provided as a conductive part. In the wiring 7, nickel (Ni) as substrate metal is coated with gold (Au). As materials forming the wiring 7, there may be used silver (Ag), tungsten (W), aluminum (Al), etc. as well as gold (Au) and nickel (Ni).

On the one surface of the relay substrate 5 having the wiring 7 provided, markers 7a are provided for positioning the arranged positions of the photodetector 4 to be arranged on the relay substrate 5.

The photodetector 4 forming the hybrid optical element and the photodetector device according to the present invention is previously attached to the relay substrate 5.

Figure 11:
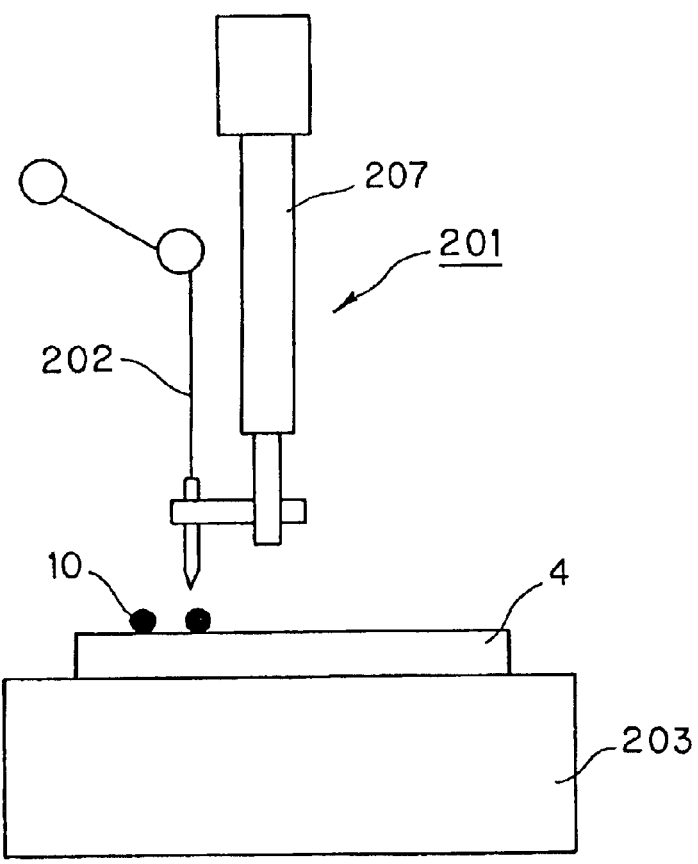
FIG. 11 is a side view showing a state that wire ball bumps are formed on a photodetector by using a wire bonder in a manufacturing step of the hybrid optical element.

In order to attach the photodetector 4 to the relay substrate 5, as firstly shown in FIG. 11, wire ball bumps 10 of gold (Au) are formed on electrode terminals made of, for instance, aluminum (Al) formed in the photodetector 4 under ultrasonic wave applied from a ultrasonic horn 207 by employing, for instance, a wire bonder 201. Gold is supplied to the photodetector 4 as a gold wire (Au wire) 202. At this time, the photodetector 4 is mounted on a stage 203 with a temperature adjuster to heat the entire part of the photodetector 4 to 100° C. or higher so that the wire ball bumps 10 are effectively formed.

Figure 12:
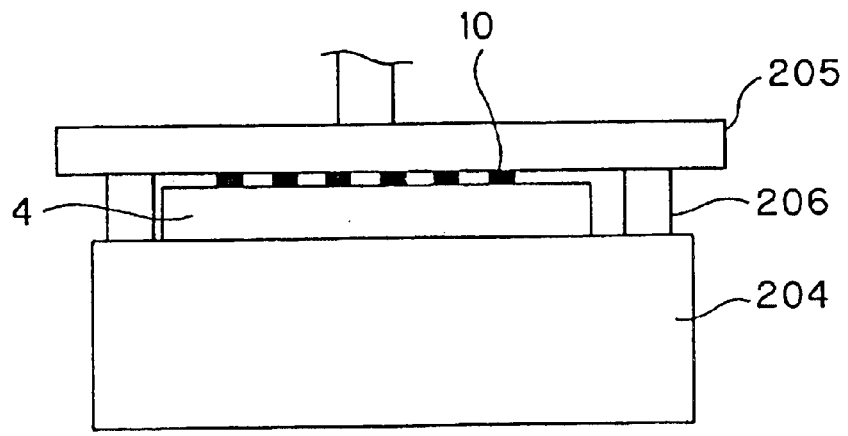
FIG. 12 is a side view showing a state that the wire ball bumps on the photodetector are shaped in the manufacturing step of the hybrid optical element.

Then, as shown in FIG. 12, to make the height of the respective wire ball bumps 10 uniform, the photodetector 4 is mounted on a pressing base 204 to perform a pressing process by using a flat press plate 205 with good flatness. At this time, the amount of fall of the press plate 205 to the photodetector 4 is regulated by a spacer 206 mounted on the pressing base 204.

Figure 13:
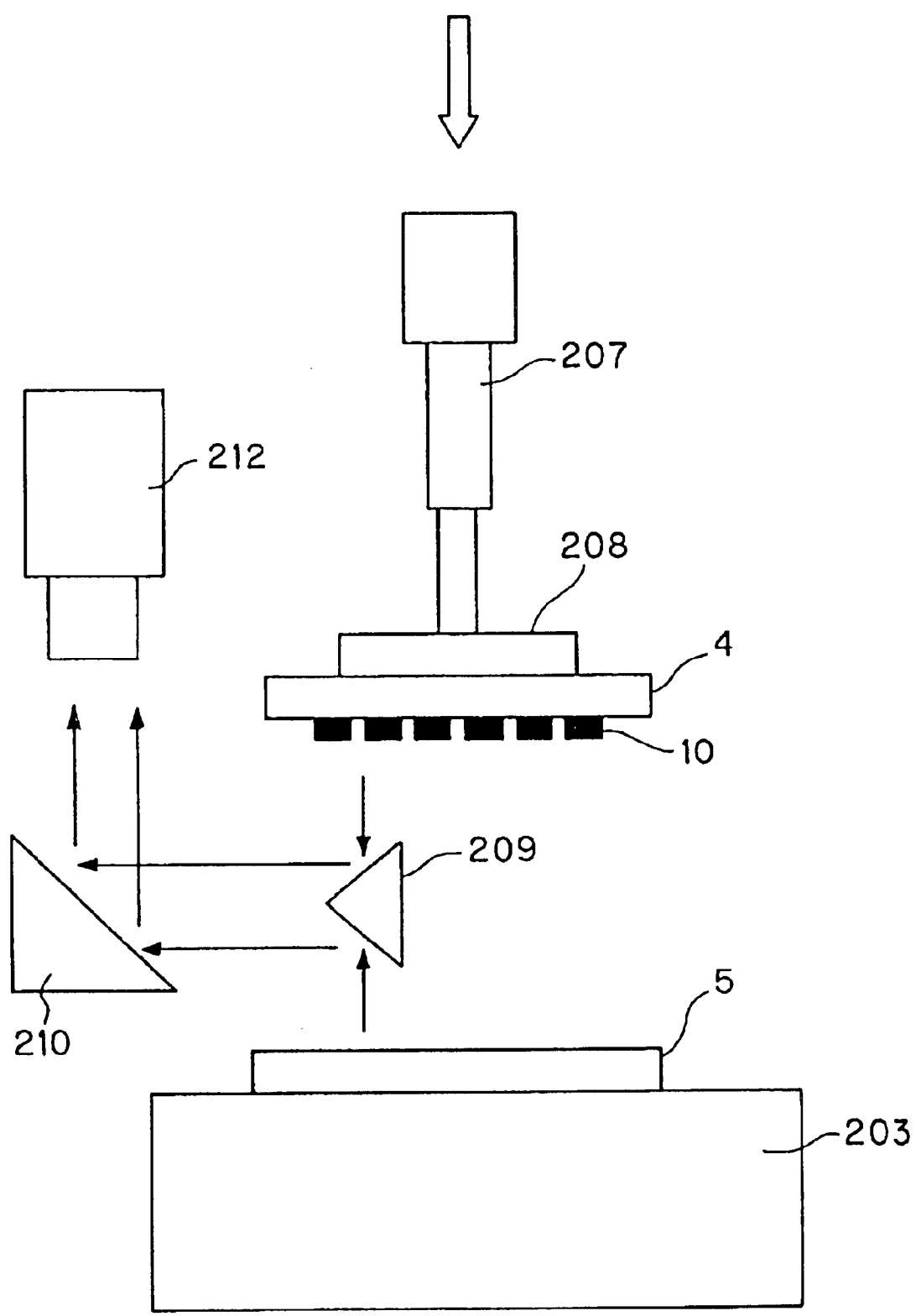
FIG. 13 is a side view showing a state that the photodetector and the relay substrate are positioned in the manufacturing step of the hybrid optical element.

Subsequently, as shown in FIG. 13, the photodetector 4 on which the wire ball bumps 10 are formed is bonded to the relay substrate 5. This bonding, that is, a bump bonding is carried out in such a manner that the photodetector 4 is held by the ultrasonic horn 207 through an adsorbing collet 208 and the photodetector 4 is pressed to the relay substrate 5 mounted on the stage 203 with the temperature adjuster heated to about 100° C. to undergo a ultrasonic vibration.

At this time, the markers for positioning are formed on the relay substrate 5 and the photodetector 4 to position them in accordance with the markers. The positioning operation is carried out in such a way that the markers of the relay substrate 5 and the markers of the photodetector 4 are observed at the same time by a CCD camera 212 through a positioning prism 209 and a prism 210 arranged between the relay substrate 5 and the photodetector 4 opposed to each other. The positioning prism 209 has an oblique surface directed to the relay substrate 5 and an oblique surface directed to the photodetector 4 to allow light from the relay substrate 5 and light from the photodetector 4 to reach the CCD camera 212 at the same time.

Figure 14:
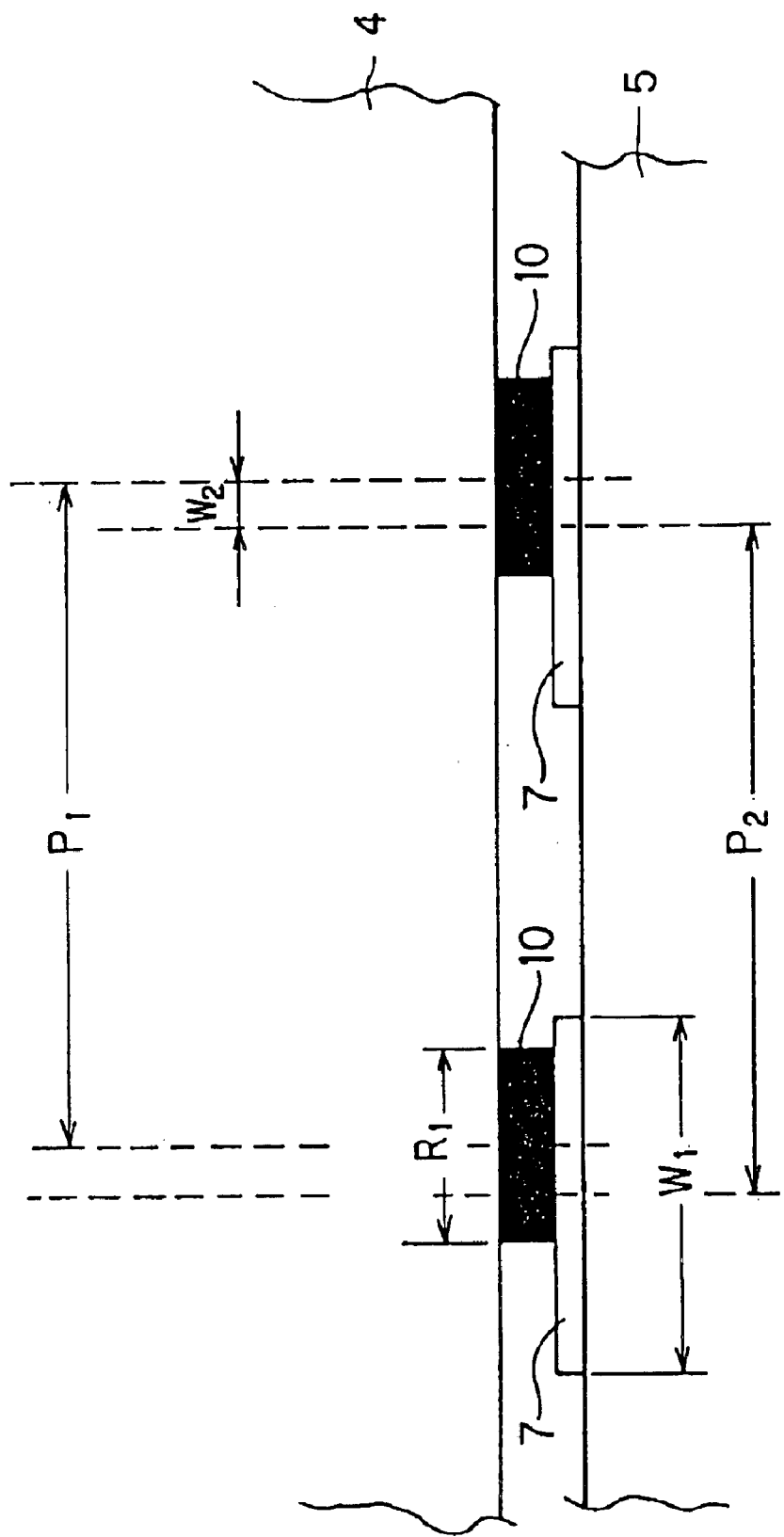
FIG. 14 is a side view showing a main part under a state that the photodetector is connected to the relay substrate through bumps in the manufacturing step of the hybrid optical element.

In this bonding process, the wire ball bumps 10 of the photodetector 4 need to assuredly come into contact with the wiring 7 on the relay substrate 5. In order to allow the wire ball bumps 10 to assuredly come into contact with the wiring 7, for instance, as shown in FIG. 14, the width W1 of the wiring 7 of the relay substrate 5 may be set to 100 mm and the diameter R1 of the wire ball bump 10 may be set to 60 mm. When the width W1 of the wiring 7 is larger than the diameter R1 of the wire ball bump 10, as described above, a positioning step is easily carried out. That is, when the pitch P1 of the wire ball bumps 10 is equal to the pitch P2 of the wiring 7, the difference between the width W1 of the wiring 7 and the diameter R1 of the wire ball bump 10 designates the width W2 of positional displacement upon bonding.

After the positioning process, as shown in FIG. 13, the ultrasonic wave is applied to the photodetector 4 from its back surface through the adsorbing collet 208 connected to the ultrasonic horn 207. The wire ball bumps 10 are electrically and mechanically connected to the wiring 7 through ultrasonic eutectic by the ultrasonic wave.

In the bonding process, a small amount of ultraviolet (UV) curing resin is supplied to the four corner parts of the photodetector 4 and the relay substrate 5 and cured so that the photodetector 4 is bonded to the relay substrate 5 with a stronger bonding strength. In this case, the ultraviolet curing resin needs to be supplied so as not to reach the light receiving part of the photodetector 4.

When the photodetector 4 is bonded to the relay substrate 5, an anisotropic conductive material is, preferably, not employed. The anisotropic conductive materials include a liquid type material or a film type material. The liquid type material is ordinarily low in its thixotropy and expected to spread over the entire part of the photodetector 4. That is, there is a possibility that the anisotropic conductive material reaches the light receiving part of the photodetector 4. Some of the anisotropic conductive materials have different indexes of refraction from those of vacuum and absorb light. When the anisotropic conductive material reaches the light receiving part of the photodetector 4, the strength the photodetection signal in the photodetector 4 is weakened due to the absorption of light of the anisotropic conductive material. Since the index of refraction of the anisotropic conductive material is different from that of the vacuum, an optical distance is modulated. In this case, the film thickness of the anisotropic conductive material reaching the light receiving part of the photodetector 4 needs to be controlled. However, such a control is difficult, so that the anisotropic conductive material is preferably not used.

Figure 15A:
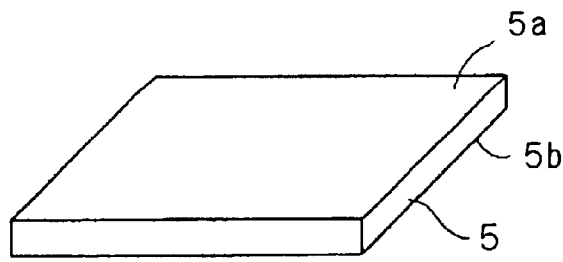
FIGS. 15A to 15F are perspective views and side views showing the manufacturing step of a photodetector unit when the relay substrate of the hybrid optical element is transparent.

When the relay substrate 5 is formed with a material having no absorption property relative to the light of the wavelength emitted from the semiconductor laser 3, that is, a transparent material having a property of transmitting the light emitted from the semiconductor laser 3, as a base material, the above-described through hole does not need to be provided as shown in FIG. 15A. In this case, an antireflection coat (AR coat) layer is desirably provided on respective surfaces 5a and 5b or one of them of the relay substrate 5 in accordance with the wavelength of emitted light outgoing from the semiconductor laser 3. As the materials having no absorption property relative to the light of wavelength emitted from the semiconductor laser 3, may be used any of sapphire, optical glass, a synthetic resin material, a group III nitride semiconductor, zinc oxide and silicon oxide.

Figure 16:
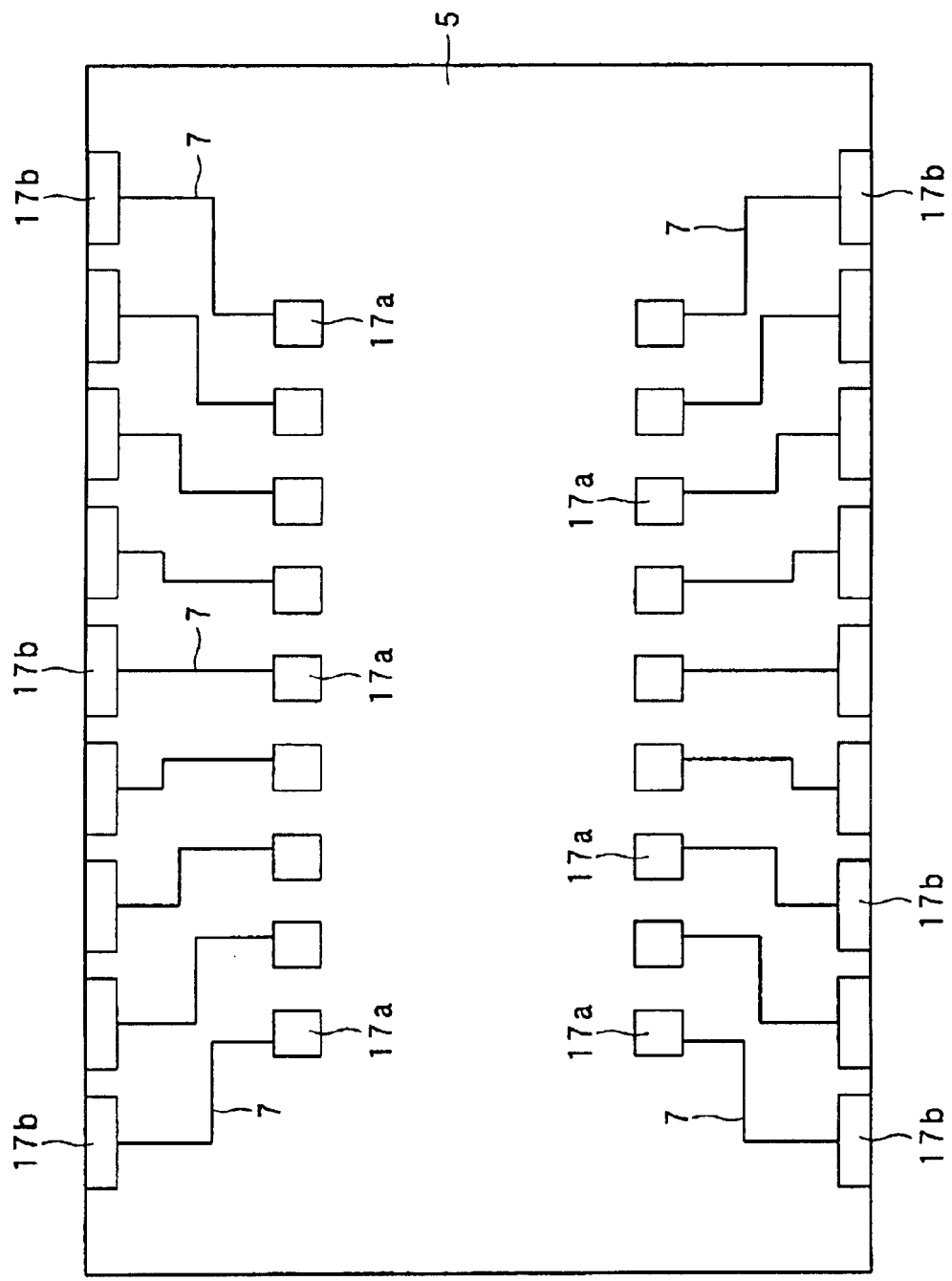
FIG. 16 is a plan view showing the transparent relay substrate forming the hybrid optical element.

On the transparent relay substrate 5, as shown in FIG. 16, wiring 7 including electrode parts 17a for bumps are formed likewise the above-described relay substrate 5. The wiring 7 is formed in such a manner that the electrode parts 17a for bumps which are connected to the photodetector 4 through bumps as mentioned above are electrically connected to terminal parts 17b to be connected to external parts.

Figure 15B:
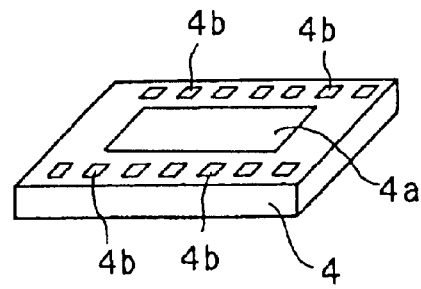

Also in this case, the photodetector 4 shown in FIG. 15B is bonded to the relay substrate 5 through bumps likewise the above-described relay substrate 5. On one surface side of the photodetector 4, a light receiving part 4a is formed. On a peripheral edge part, are provided many connecting electrodes 4b provided with wire ball bumps 10 are provided.

Figure 15C:
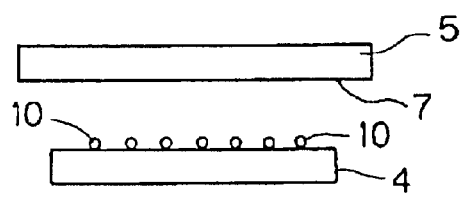
Figure 15D:
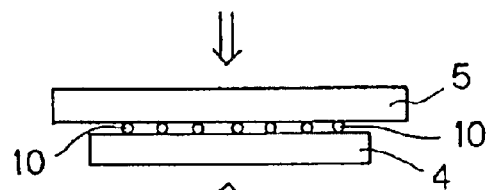

The relay substrate 5 is butted on the photodetector 4, as shown in FIG. 15C, in such a manner that the surface of the relay substrate 5 on which the wiring 7 is provided is opposed to a surface of the photodetector 4 on which the electrodes 4b provided with the wire ball bumps 10 are formed. The relay substrate 5 and the photodetector 4 butted as shown in FIG. 15C are pressed from both surface sides as shown in FIG. 15D, so that the electrodes 4b of the photodetector 4 are electrically and mechanically connected to the electrode parts 17a for bumps of the relay substrate 5 through the wire ball bumps 10.

Figure 15E:
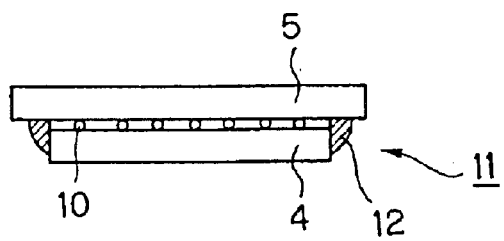
Figure 15F:
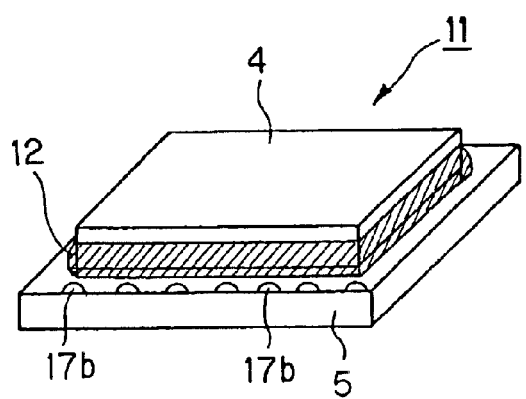

In the relay substrate 5 and the photodetector 4 bonded to each other, the peripheries of the bonded parts are covered with a sealing material such as an adhesive or low-melting glass 12 to seal inside the bonded parts, as shown in FIGS. 15E and 15F. The outer surface of the photodetector 4 may be covered with a synthetic resin or tape or the like to protect it.

The photodetector 4 is mounted on the relay substrate 5 and the bonded parts of them are sealed with the sealing material such as the low-melting glass 12 or the like as described above to form a photodetector unit 11 as shown in FIG. 15F.

Figure 17:
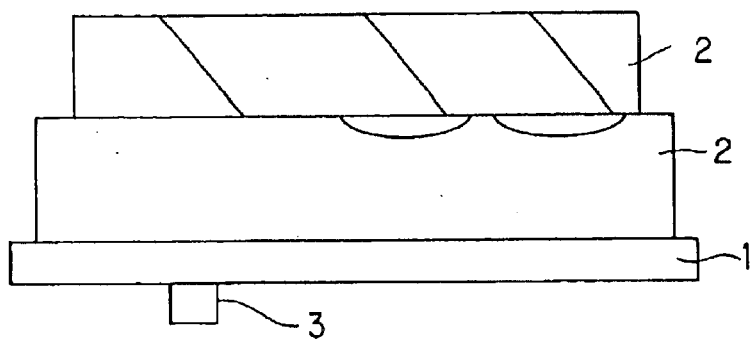
FIG. 17 is a side view showing the substrate to which a light emitting element and optical elements are attached.
Figure 18:
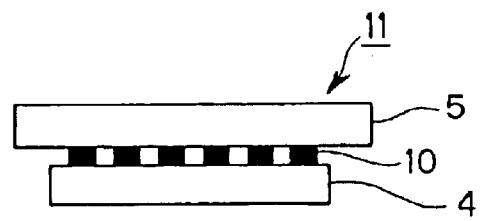
FIG. 18 is a side view showing the photodetector unit during the manufacturing step of the hybrid optical element.

Then, as shown in FIG. 18, the photodetector unit 11 in which the photodetector 4 is formed integrally with the relay substrate 5 is attached to the substrate 1 to which the optical element 2 and the semiconductor laser 3 are attached, as shown in FIG. 17. The optical element 2 and the semiconductor laser 3 are attached to the substrate 1 by a bonding process. The optical element and the semiconductor laser may be, what is called, temporarily bonded to the substrate 1 so that they can be detached in a post-step. As the adhesives to be used, there may be exemplified, for instance, silver (Ag) paste, thermosetting resin, ultraviolet (UV) curing resin, etc. To suppress a thermal deformation upon bonding, a low temperature curing resin or the ultraviolet curing resin is desirably employed.

After the photodetector unit 11 is positioned to the substrate 1 to which the optical element 2 and the semiconductor laser 3 are attached, the photodetector unit 11 is attached to the substrate 1. As for positioning, while the passive alignment that the positioning operation is performed by using markers may be utilized, is desirably used to improve a positional accuracy the active alignment that light is emitted from the semiconductor laser 3 and the positioning operation is performed while viewing an output signal from the photodetector unit 11.

Figure 19:
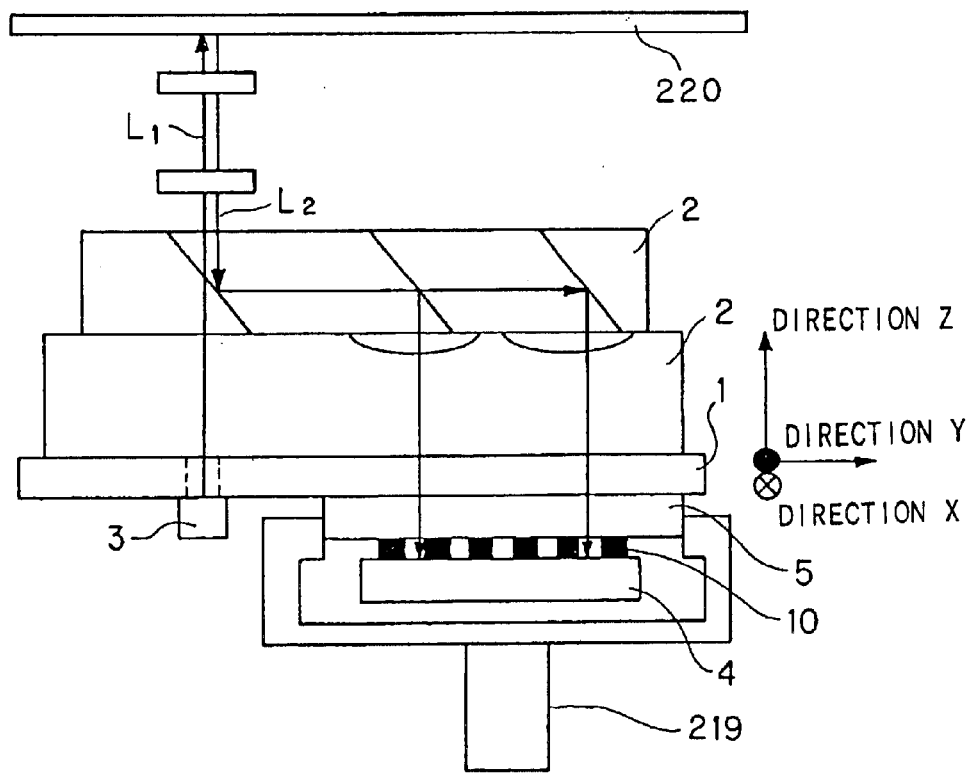
FIG. 19 is a side view showing a state that the photodetector unit is positioned on the substrate in the manufacturing step of the hybrid optical element.

When the active alignment is carried out, as shown in FIG. 19, light is emitted from the semiconductor laser 3, a light flux L1 outgoing from the semiconductor laser 3 is reflected by using a dummy disc 220 and returned to the photodetector unit 11 as a reflected light flux L2. At this time, the photodetector unit 11 is supported by a collet 219 to locate the relay substrate 5 at a position where the relay substrate 5 comes into contact with the substrate 1. The positional adjustment of the photodetector unit 11 in three directions including directions X, Y and Z which mutually intersect perpendicularly is carried out in such a way that the photodetector unit 11 is moved by monitoring an output signal from the photodetector unit 11 while the photodetector unit 11 comes into contact with the substrate 1. Since the photodetector unit 11 always comes into contact with the substrate 1, the optical path to the light receiving surface of the photodetector 4 from the dummy disc 220 is always maintained to be constant.

Figure 20:
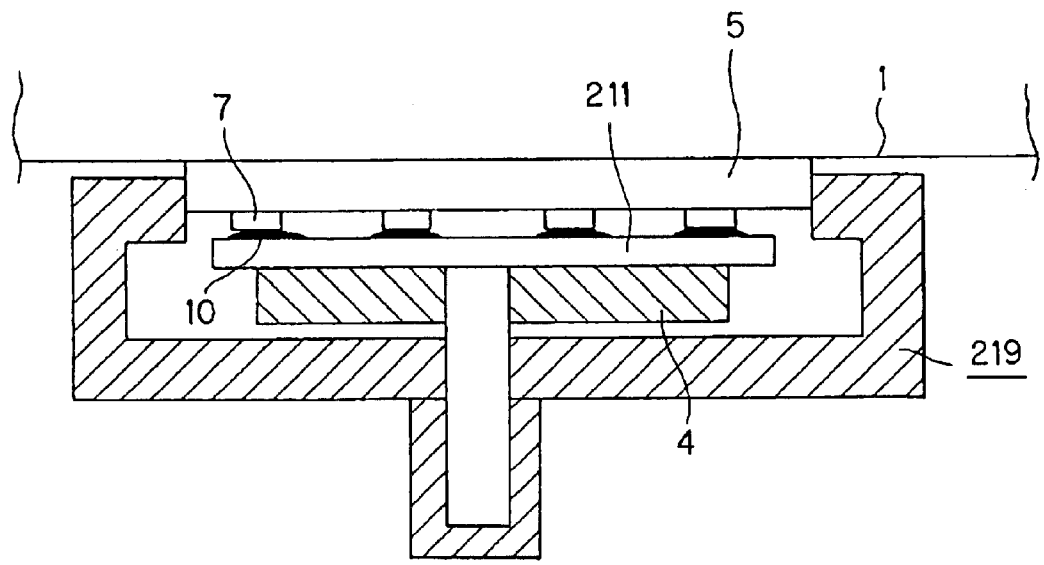
FIG. 20 is a side view showing the structure of a collet for holding the photodetector unit in the manufacturing step of the hybrid optical element.

The collet 219 for supporting the photodetector unit 111 supports, as shown in FIG. 20, the periphery of the relay substrate 5 and has a probe 211 for taking out the output signal from the photodetector 4.

In this adjustment, signals to be monitored are different depending on the arrangement of the light receiving part in the photodetector 4. For instance, the light receiving part of the photodetector 4 detects a focus error signal in accordance with an astigmatic difference method by light receiving parts A, B, C and D for receiving light in such a way that the light incident on the dummy disc 220, reflected by the dummy disc 220 and then reflected light is divided into four parts. In light receiving parts E, I and F and light receiving parts G, J and H for receiving the reflected light respectively divided into three in parallel at both the sides of the light receiving parts A, B, C and D, a tracking error signal is detected by a push-pull method. Further, in the light receiving parts for detecting an RF signal by performing a differential detection by two remaining light receiving parts K and L, the positional adjustment of the photodetector unit 11 can be carried out on the basis of the following calculation results using the outputs of light detected respectively from the light receiving parts. That is, as for a direction X along a recording track on a recording medium in FIG. 21, the following calculation is used.

$(A+D)-(B+C)$

Figure 21:
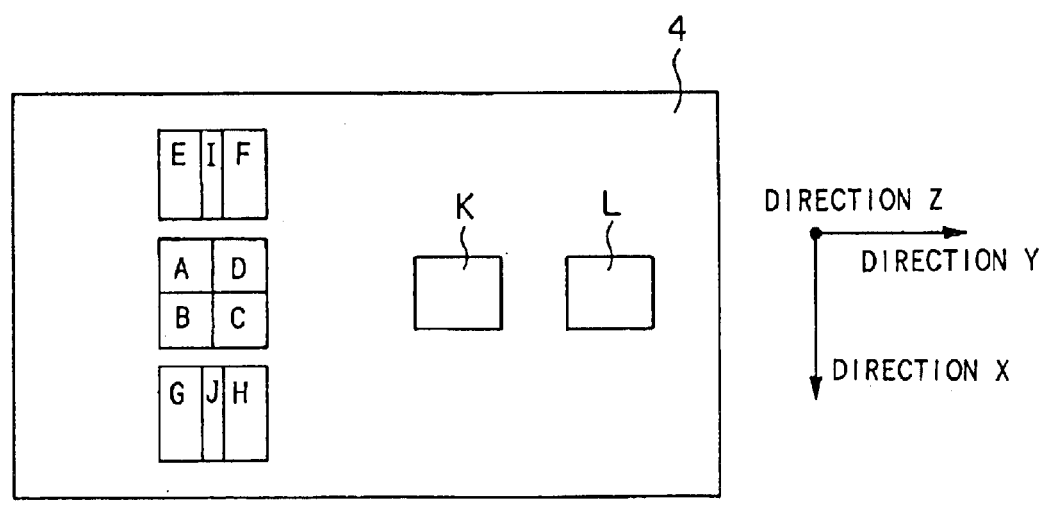
FIG. 21 is a plan view showing a pattern of the light receiving part of the photodetector forming the hybrid optical element.

As for a direction Y perpendicularly intersecting the recording track of the recording medium in FIG. 21, the following calculation is used.

$(A+B)-(D+C)$ or $(E+G)-(F+H)$

A direction Z in FIG. 21 as the direction of an optical axis of the light flux outgoing from the semiconductor laser 3 can be adjusted by moving the semiconductor laser 3 in the direction of optical axis or providing a spacer having a through hole between the photodetector unit 11 and the substrate 1. When a prism which polarizes the light flux outgoing from the semiconductor laser 3 by 90 to make it incident on the substrate 1 is attached to the substrate 1, the direction Z in FIG. 21 can be adjusted by moving the semiconductor laser 3 along the main surface of the substrate 1.

As patterns of the light receiving part of the photodetector 4 forming the hybrid optical element, various kinds of patterns are employed. In the active alignment, a calculation for obtaining a signal to be monitored is properly determined depending on the pattern of the light receiving part.

Now, steps for manufacturing the relay substrate 5 will be described.

Figure 22:
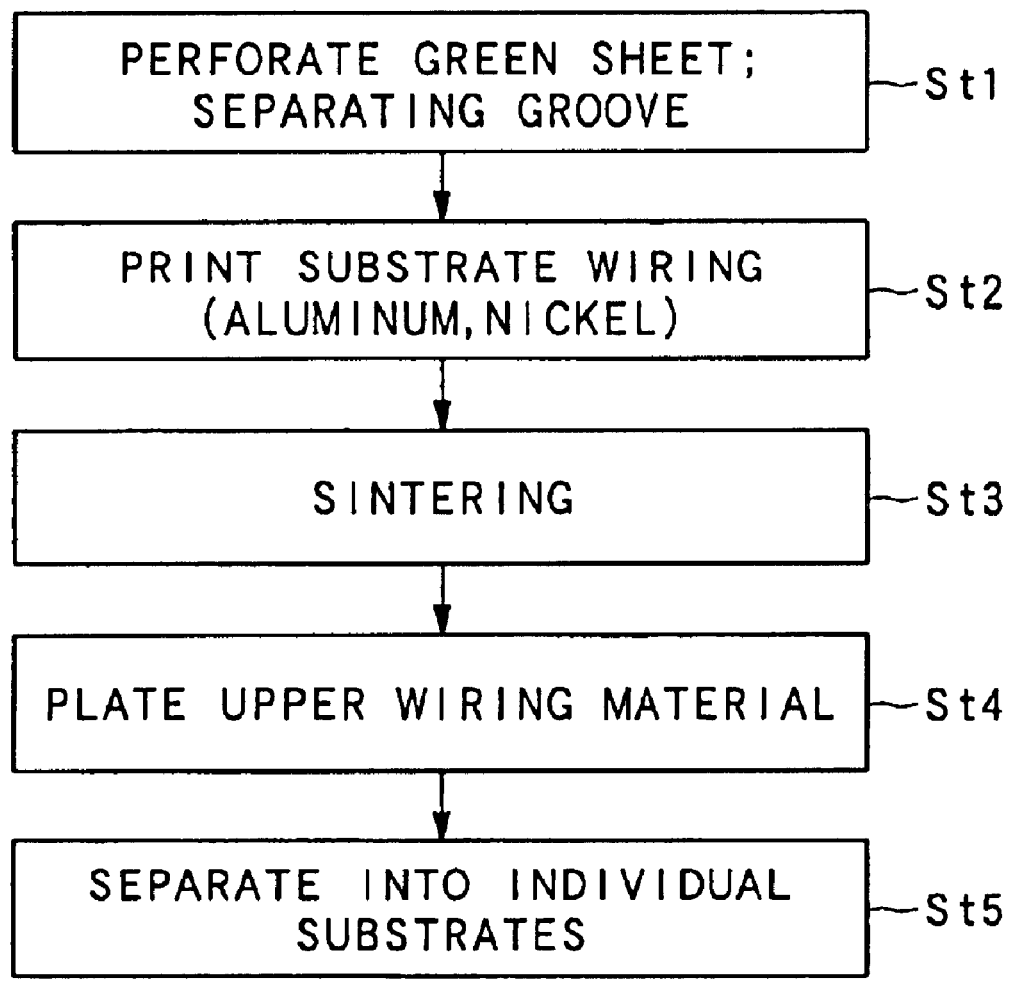
FIG. 22 is a flow chart showing a manufacturing step of a relay substrate when a base material is ceramics.

In order to manufacture the relay substrate 5, when the base material of which the relay substrate 5 is made is a ceramic material including any of alumina, aluminum nitride or glass epoxy, since these materials do not transmit the light of a visible radiation band, holes are firstly opened on a material having a plurality of relay substrates 5 connected and grooves are formed thereon to separate the material into individual relay substrates 5 in step St1, as shown in FIG. 22. Then, in step St2, aluminum or nickel forming the substrate layer of the wiring 7 is formed by printing. In step St3, this substrate layer is sintered. In next step St4, an upper wiring material such as gold is formed on the substrate layer of the wiring 7 by a plating method. In step St5, the material is separated into the individual relay substrates 5. The ceramic material employed here is advantageously inexpensive and high in its strength even when a thickness is decreased.

Figure 23:
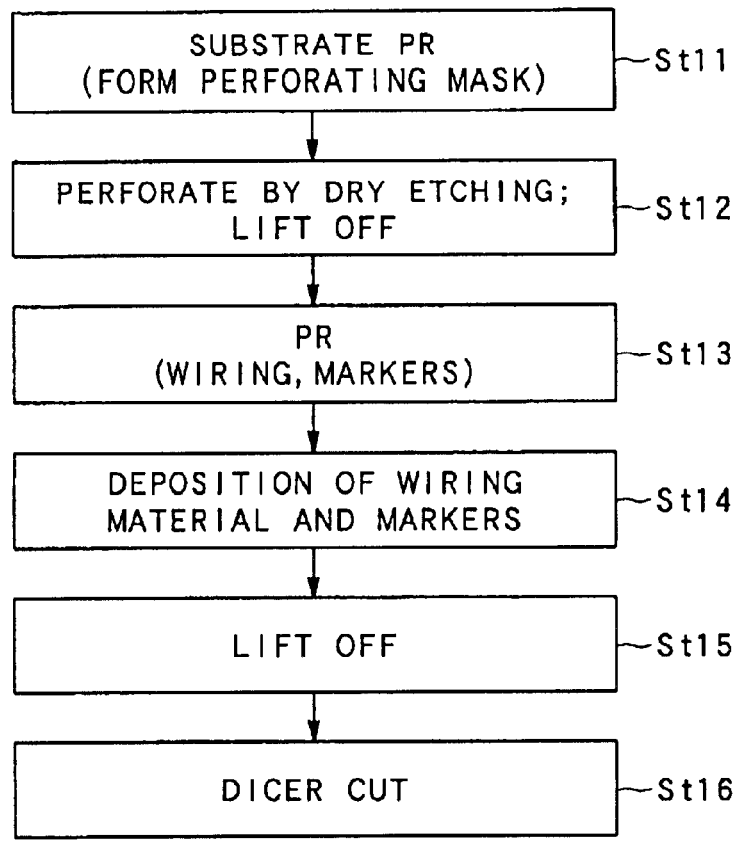
FIG. 23 is a flow chart showing a manufacturing process of the relay substrate when a base material is a semiconductor.

When the material forming the relay substrate 5, that is, the base material is a semiconductor material including any of silicon (Si), gallium-arsenic (GaAs), indium-phosphorus (InP) or zinc selenide (ZnSe), the wiring 7 is formed by, what is called a dry etching method, as shown in FIG. 23. Since any of these semiconductor materials is a material to be used in an ordinary semiconductor manufacturing process, the use of this material is advantageous from the viewpoint that a working process is established. That is, in step St11, a perforating mask is formed. In step St12, a wafer in which a plurality of relay substrates 5 are connected together is perforated by a dry etching method. Then, in step St13 to step St15, a wiring pattern and markers are printed, deposited and lifted off to form the wiring 7 and the markers 7a. In step St16, the wafer is separated into the individual relay substrates 5 by cutting with a dicer.

Since the semiconductor material used here has a cleavage property, a plurality of relay substrates are easily formed on the wafer and then they are readily separated into the individual relay substrates 5. This step may be a general dicer step or a cleavage step in which flaws are provided and broken. A step of photolithography using a semiconductor material has been already established in a semiconductor manufacturing process. Thus, the line width, the pitch and the thickness of the wiring 7 can be highly accurately controlled. When the size accuracy of the wiring 7 and the size accuracy of the relay substrate 5 are low, that is, tolerance is large, a margin corresponding to the tolerance needs to be taken likewise in the substrate 1, and accordingly, the substrate 1 is enlarged. When the substrate 1 is enlarged, all the size of the hybrid optical element is also enlarged. Therefore, when the size accuracy of the wiring 7 and the size accuracy of the relay substrate 5 are high, the substrate 1 can be made compact and the entire body of the hybrid optical element can be made compact.

Since the semiconductor material used for the relay substrate 5 constituting the present invention does not absorb the light of a band gap or lower, when the wavelength of light emitted from the semiconductor laser 3 as a light source is located in the band gap or lower, the through hole 6 does not need to be provided on the relay substrate 5.

Figure 24:
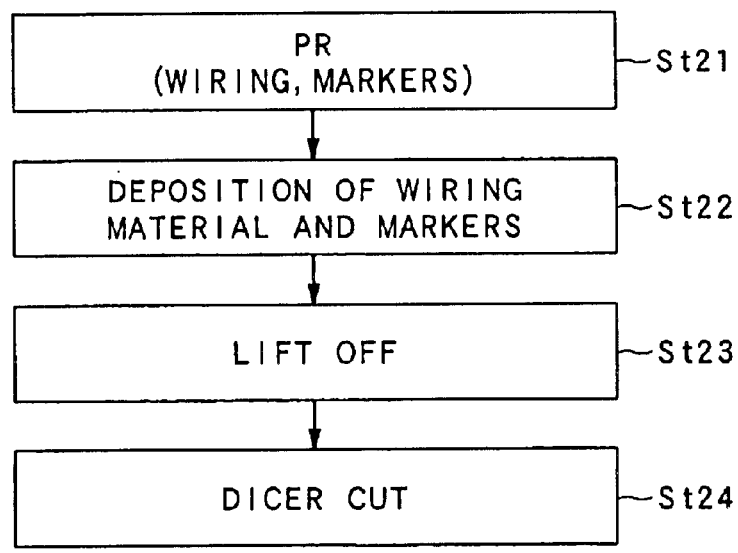
FIG. 24 is a flow chart showing a manufacturing process of the relay substrate when a base material is a transparent material.

Further, also when the base material as a material forming the relay substrate 5 is any of materials including sapphire, optical glass, a synthetic resin material, a group III nitride semiconductor, zinc oxide and silicon oxide, and which does not absorb the light located in a wavelength band and emitted from the semiconductor laser 3, the through hole 6 does not need to be provided on the relay substrate 5. In this case, to manufacture the relay substrate 5, in step St21 to step St23 shown in FIG. 24, respective steps that a wiring pattern and markers are printed, deposited and lifted off are carried out on a wafer in which a plurality of relay substrates 5 are continued to form the wiring 7 and the markers. In the step St24, the wafer is separated into the individual relay substrates 5 by cutting with a dicer.

In the above-described respective examples, although the wire ball bumps 10 are formed for each photodetector 4, the wire ball bumps 10 may be formed on the wafer in which a plurality of photodetectors 4 are continued. Similarly, in each example, although an individual photodetector 4 is bonded to an individual relay substrate 5, they may be bonded to each other under a state that both the photodetectors 4 and the relay substrates 5 are formed on the wafers or either of them is formed on the wafer. The photodetectors may be preferably bonded to the relay substrates in the forms of wafers in view of productivity.

In the above-described examples, although the wire ball bumps 10 are formed on the photodetector 4 and the wiring 7 is formed on the relay substrate 5, the wiring 7 may be formed on the photodetector 4 and the wire ball bumps 10 may be formed on the relay substrate 5.

Further, in the above-described examples, although the semiconductor laser 3 is employed as a light source, the kind of the light source may not be limited to the semiconductor laser, and, for instance, a light emitting element using an organic material or the like may be employed.

INDUSTRIAL APPLICABILITY

As mentioned above, since the hybrid optical element or the photodetector device according to the present invention includes a substrate; at least one optical element attached to one surface of the substrate; a light emitting element and a photodetector or a photodetector attached to the other surface of the substrate; and an intermediate member interposed between the substrate and the photodetector. The intermediate member has a hole through which a light flux incident on the photodetector is allowed to pass or is made of a transparent base material having no absorption property for light of wavelength emitted from the light emitting element and has a part with a conductivity by which the terminal of the photodetector is connected to a conductor pattern on the substrate. Accordingly, an active alignment that a positioning operation is carried out while the photodetection signal outputted from the photodetector is monitored can be easily performed to improve the mounting accuracy of the photodetector. The improvement of the mounting accuracy of the photodetector makes it possible to improve an accuracy meeting the short wavelength of the light source and easily meet the optical pick-up device using a complicated signal detection.

Since a conventionally utilized existing equipment can be used to manufacture the hybrid optical element and the photodetector device according to the present invention, they can be manufactured without increasing a manufacture cost.

What is claimed is:

1. A hybrid optical element comprising:
a substrate;
at least one optical element attached to one surface of the substrate;
a light emitting element and a photodetector attached to the other surface of the substrate; and
an intermediate member interposed between the substrate and the photodetector; wherein the intermediate member is formed with a material having an absorption property in the wavelength of light emitted from the light emitting element and has a hole through which a light flux incident on the photodetector is allowed to pass, and a part with a conductivity by which a terminal of the photodetector is connected to a conductor pattern on the substrate.

2. The hybrid optical element according to claim 1, wherein the intermediate member is composed of any one of materials such as alumina, aluminum nitride or glass epoxy.

3. The hybrid optical element according to claim 1, wherein the intermediate material is composed of any of materials such as silicon, gallium-arsenic, indium-phosphorus or zinc selenide.

4. The hybrid optical element according to claim 1, wherein the intermediate member is provided with electrode pads connected to the part with the conductivity, the photodetector is provided with electrode pads connected to terminals and the electrode pads of the intermediate member are bonded to the electrode pads of the photodetector by a flip chip bonding process under a state that a light receiving surface of the photodetector is directed toward the intermediate member.

5. A hybrid optical element comprising:
a substrate;
at least one optical element attached to one surface of the substrate;
a light emitting element and a photodetector attached to the other surface of the substrate; and
an intermediate member interposed between the substrate and the photodetector; wherein the intermediate member is formed with a transparent material having no absorption property in the wavelength of light emitted from the light emitting element and has a part with a conductivity by which a terminal of the photodetector is connected to a conductor pattern on the substrate.

6. The hybrid optical element according to claim 5, wherein the intermediate member is composed of any one of materials such as sapphire, optical glass, a synthetic resin material, a group III nitride semiconductor, zinc oxide, and SiC.

7. The hybrid optical element according to claim 5, wherein an AR coat film which does not reflect the light of wavelength emitted from the light emitting element is formed at least one surface of the intermediate member.

8. The hybrid optical element according to claim 5, wherein the intermediate member is provided with electrode pads connected to the part having the conductivity, the photodetector is provided with electrode pads connected to terminals and the electrode pads of the intermediate member are bonded to the electrode pads of the photodetector by a flip chip bonding process under a state that a light receiving surface of the photodetector is directed toward the intermediate member.

9. The hybrid optical element according to claim 5, wherein a part between the intermediate member and the photodetector is sealed by a sealing material.

10. A photodetector device comprising:
a substrate;
at least one optical element attached to one surface of the substrate;
a light emitting element and a photodetector attached to the other surface of the substrate; and
an intermediate member interposed between the substrate and the photodetector; wherein the intermediate member is formed with a transparent material having no absorption property in the wavelength of light emitted from the light emitting element and has a part with a conductivity by which a terminal of the photodetector is connected to a conductor pattern on the substrate.

11. A method for manufacturing a hybrid optical element comprising the steps of:

attaching at least one optical element on one surface of a substrate having a conductor pattern;

attaching a light emitting element to the other surface of the substrate;

positioning and attaching a photodetector to an intermediate member having a hole through which a light flux incident on the photodetector is allowed to pass and a part with a conductivity and interposed between the substrate and the photodetector;

then, attaching the intermediate member to the other surface of the substrate; and connecting a terminal of the photodetector to a conductor pattern on the substrate through the part with the conductivity of the intermediate member.

12. The method for manufacturing a hybrid optical element according to claim 11, wherein the optical element is positioned and attached to the substrate by using as a reference a through hole formed on the substrate for allowing the light flux emitted from the light emitting element to pass.

* * * * *